US008737632B2

(12) United States Patent
Denney, III

(10) Patent No.: US 8,737,632 B2

(45) Date of Patent: May 27, 2014

(54) ACOUSTIC ENERGY CONTROL SYSTEM FOR A ROOM

(76) Inventor: Theodore W. Denney, III, Irvine, CA (US)

( * ) Notice: Subject to any disclaimer, the term of this patent is extended or adjusted under 35 U.S.C. 154(b) by 966 days.

(21) Appl. No.: 12/655,776

(22) Filed: Jan. 8, 2010

(65) Prior Publication Data

US 2011/0170720 A1 Jul. 14, 2011

(51) Int. Cl.
*H03G 3/00* (2006.01)

(52) U.S. Cl.
USPC .............................................. 381/64; 381/61

(58) Field of Classification Search
USPC ............. 381/303, 61–65, 150, 337–339, 335, 381/162, 152, 87; 181/30, 286, 198, 284, 181/148, 153
See application file for complete search history.

(56) References Cited

U.S. PATENT DOCUMENTS 3,672,463 A * 6/1972 Jaffe et al. ...................... 181/30
4,280,019 A * 7/1981 Propst et al. ................ 381/73.1

* cited by examiner

*Primary Examiner* — Vivian Chin
*Assistant Examiner* — David Ton
(74) *Attorney, Agent, or Firm* — Morland C. Fischer

(57) ABSTRACT

A mechanical acoustic energy control system to be located in a room in which one or more audio speakers are also located so that the audio output of the speakers can be distributed throughout the room to enable a listener in the room to be surrounded by sound. A master acoustic resonator attached to the front wall of the room is adapted to vibrate and thereby produce acoustic waves corresponding to the acoustic energy generated by the speakers. A low frequency (e.g., bass) acoustic resonator sits on the floor of the room below the master acoustic resonator. The low frequency acoustic resonator is adapted to vibrate to reflect low frequency acoustic waves produced by the speakers and the master acoustic resonator. A satellite acoustic resonator is located on each of the back and opposing side walls of the room. The satellite acoustic resonators are adapted to vibrate in response to the acoustic waves reflected thereto by the speakers, the master acoustic resonator, and the low frequency acoustic resonator. The vibration of the satellite acoustic resonators controls the dispersion pattern of acoustic waves in the room so that the listener hears a richer, fuller and more natural sound.

21 Claims, 5 Drawing Sheets

ACOUSTIC ENERGY CONTROL SYSTEM FOR A ROOM

BACKGROUND OF THE INVENTION

1. Field of the Invention

This invention relates to a mechanical acoustic energy control system for a room in which a listener is seated in front of one or more audio speakers or live performers. A set of compact acoustic resonators are strategically located around the room to redirect the acoustic energy generated by the speakers or live performers to control the dispersion pattern of acoustic waves in the room so that the listener is surrounded by a richer, fuller and more natural sound.

2. Background Art

A listener may often find himself seated in a family room or an auditorium while listening to music or other audio content being emitted from one or more speakers or performers. In many cases, the speakers or performers are located against a wall, such that the sound transmitted to the listener is uni-directional. That is to say, the user will not feel as if he is surrounded by sound coming to him from all directions. Moreover, the configuration of the room could negatively impact the quality of the bars, mid-range and high frequencies of the sound. Therefore, it would be desirable to have innocuous (i.e., space-efficient and aesthetically-pleasing) acoustic energy control devices to be strategically placed around the room or auditorium so as to redirect the acoustic energy therewithin, whereby the listener will be surrounded by a rich, full and more natural sound that is pleasing to his ear without the use of additional speakers.

One example of a known acoustic energy generator consists of a resonator bowl that is manufactured from a precious metal. The resonator bowl rests upon a stand formed by a set of pins which project from the top of a block of wood. As the resonator bowl vibrates, sound waves are distributed within the room. However, the manufacture of such a precious metal resonator is expensive and generally impractical for use in large rooms. Moreover, a single resonator bowl in and of itself will be largely ineffective to adequately redirect the acoustic energy within the room to create a natural acoustic sound.

SUMMARY OF THE INVENTION

In general terms, a mechanical acoustic energy control system is disclosed by which a set of compact, relatively inexpensive and aesthetically-pleasing acoustic resonators are strategically positioned around a room in which a listener is seated so that sound is transmitted to the listener from all directions. The acoustic energy control system includes a master acoustic resonator mounted on the front wall of the room between a pair of audio speakers. Located on the floor of the room adjacent the front wall so as to lie below the master acoustic resonator is a low frequency acoustic resonator. A satellite acoustic resonator is located on each of the rear wall and opposing side walls at approximately the mid-point therealong. The satellite acoustic resonators are attached to the rear and side walls of the room at the same elevation above the floor as the master acoustic resonator.

The master acoustic resonator mounted on the front wall of the room is preferably manufactured from metal that can be tuned to target harmonics and includes upper and lower resonator bowls that face one another and are separated by an intermediate resonator disk located therebetween. The master acoustic resonator is suspended above a stand of a resonator support by a rod that runs upwardly from the stand and axially through each of the upper and lower resonator bowls and the intermediate disk. The stand which is held against the front wall by means of hook-and-loop fasteners is preferably manufactured from a wood (e.g., maple) that is selected to control the resonant characteristics of the master acoustic resonator. The master acoustic resonator will vibrate in response to the output of the nearby audio speakers so as to transmit corresponding sound waves to each of the low frequency acoustic resonator and the satellite acoustic resonators located around the room.

The low frequency acoustic resonator that is located on the floor of the room below the master acoustic resonator includes an upturned resonator bowl. The resonator bowl is seated on a stand of a resonator support that lies on the floor between the pair of speakers. Each of the satellite acoustic resonators also includes an upturned resonator bowl to be laid upon a metallic seat that is affixed to the top of a resonator support. Each satellite resonator support is preferably manufactured from wood and held against a respective one of the rear and side walls of the room by means of hook- and -loop fasteners. The seat of the resonator support which is held against each one of the opposing side walls of the room is preferably manufactured from a magnetic material, while the seat of the resonator support which is held against the rear wall is manufactured from a non-magnetic material. The low frequency and satellite resonator bowls function as tuned resonators that become excited and vibrate in response to the sound waves transmitted thereto by the audio speakers and the master acoustic resonator so as to redirect and redistribute the acoustic energy within the room, whereby the listener will be surrounded by a natural sound coming to him from all directions.

DESCRIPTION OF THE PREFERRED EMBODIMENT

Figure 1:
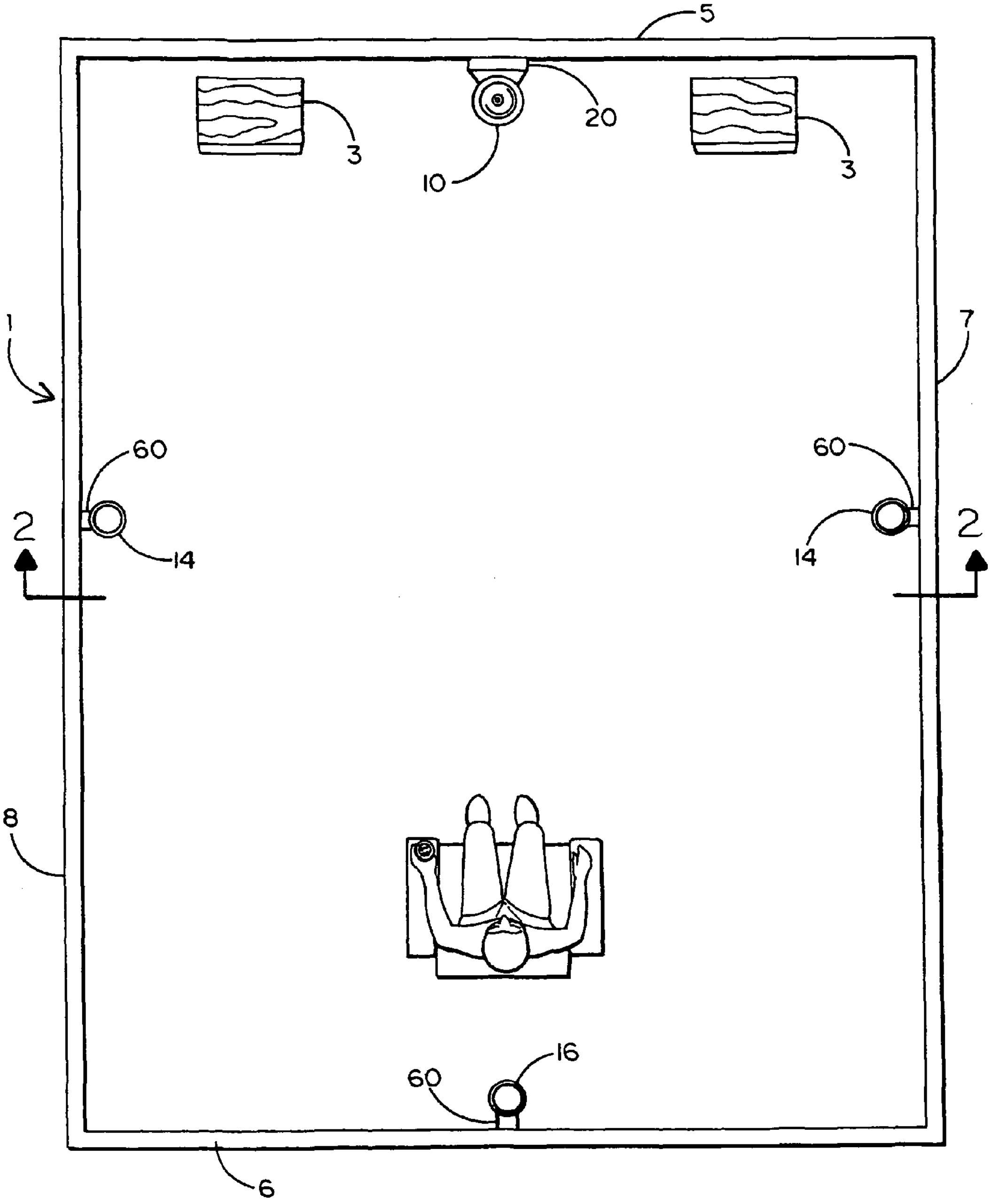
FIG. 1 shows a room in which a pair of audio speakers and a listener are located and the acoustic energy control system of the present invention is strategically positioned.
Figure 2:
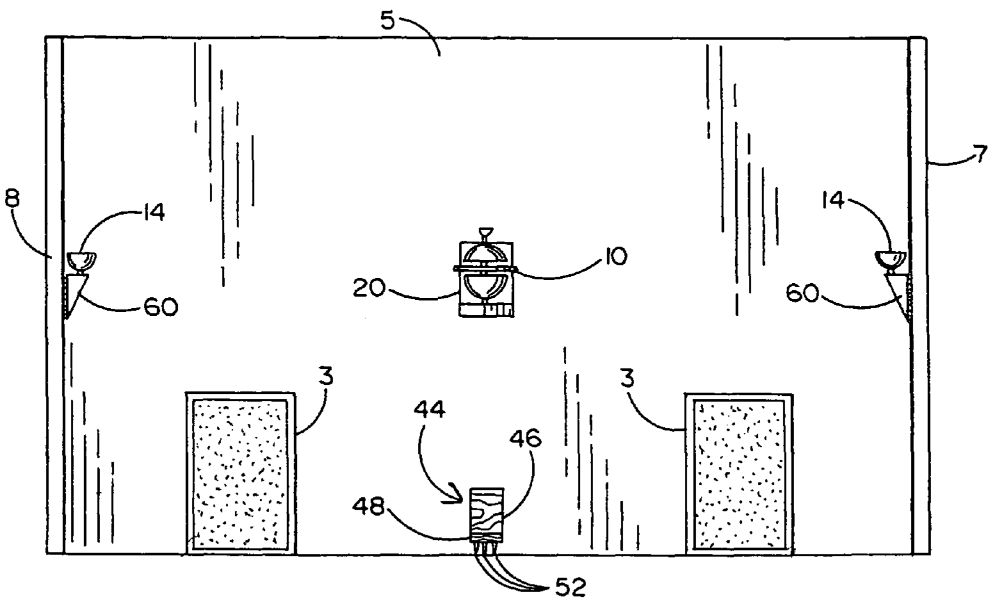
FIG. 2 shows the front wall of the room taken along lines 2-2 of FIG. 1.

A mechanical acoustic energy control system according to a preferred embodiment of this invention is initially described while referring to FIGS. 1 and 2 of the drawings, where there is shown a room 1 around which the system is strategically located to enhance the acoustic quality of sound that is emitted from one or more (e.g., a pair of) audio speakers 3. In this case, the room 1 is that common to a typical family room or den having a front wall 5, a rear wall 6, and a pair of opposing side walls 7 and 8 which extend between the front and rear walls 5 and 6. However, the sound may also be emitted by live performers, and the room could also be a theater, auditorium, or the like. The audio speakers 3 which are to be connected to an audio amplifier or some other source of audio content (not shown) are spaced from one another along the front wall 5. A listener is shown seated within the room 1 adjacent the rear wall 6 thereof so as to be located between the side walls 7 and 8. However, the precise location of the listener in the room 1 forms no part of this invention so long as the listener is in position to hear the audio output produced by the speakers 3.

As will be explained in greater detail hereinafter, the presently-disclosed acoustic energy control system includes a master acoustic resonator 10 (best shown in FIGS. 3-5) which is attached to the front wall 5 of the room 1. As shown in FIG. 2, the master acoustic resonator 10 is mounted against the front wall 5 so as to preferably lie midway between the speakers 3 at an elevation above the floor corresponding to approximately the eye level of the listener. Located below the master acoustic resonator 10 where low frequency sound waves are known to be directed is a free-standing low frequency acoustic resonator 12 (best shown in FIGS. 6 and 7). As shown in FIG. 2, the low frequency acoustic resonator 12 stands upwardly from the floor of the room 1 so as to also lie midway between the speakers 3.

Figure 8:
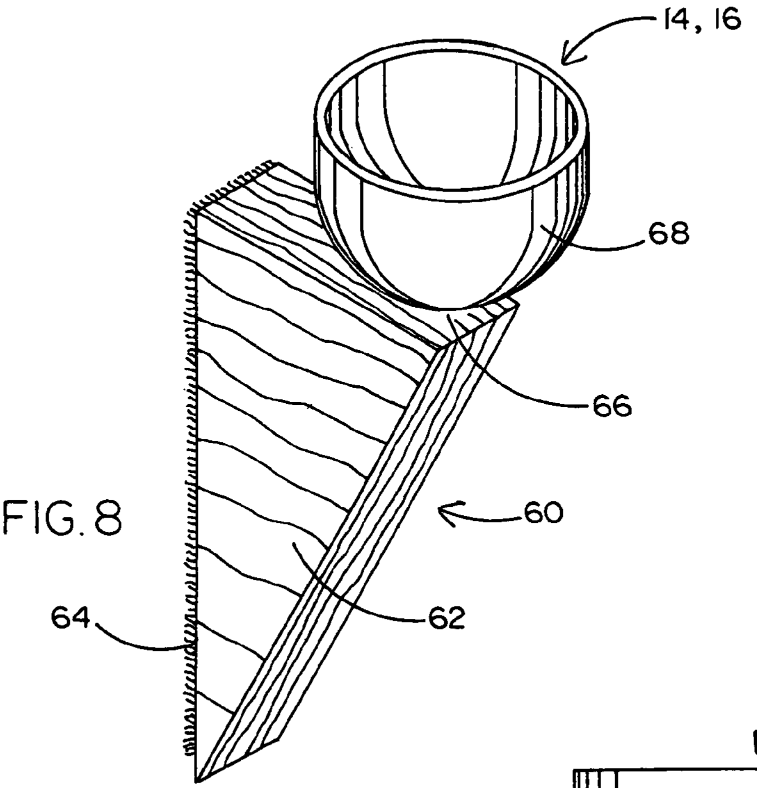
FIGS. 8 and 9 illustrate a preferred embodiment for a satellite acoustic resonator of the acoustic energy control system of this invention.
Figure 9:
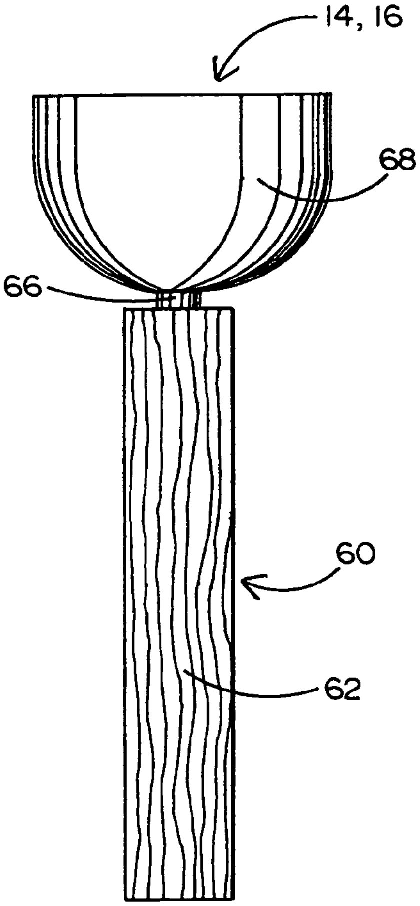

Attached to the side walls 7 and 8 of the room 1 is a pair of magnetically coupled satellite acoustic resonators 14 (one of which being shown in FIGS. 8 and 9). The satellite acoustic resonators 14 are preferably attached to respective side walls 7 and 8 so as to lie midway between the front and rear walls 5 and 6 of the room 1. Attached to the rear wall 6 of the room 1 is a gravitationally-coupled acoustic resonator 16. As will soon be explained, the structural configuration of the magnetically-coupled and gravitationally-coupled satellite acoustic resonators 14 and 16 is identical. The satellite acoustic resonator 16 is preferably attached to the rear wall 6 so as to lie midway therealong. The satellite acoustic resonators 14 and 16 attached to the side walls 7 and 8 and the rear wall 6 of room 1 have the same elevation above the floor as the master acoustic resonator 10.

Figure 3:
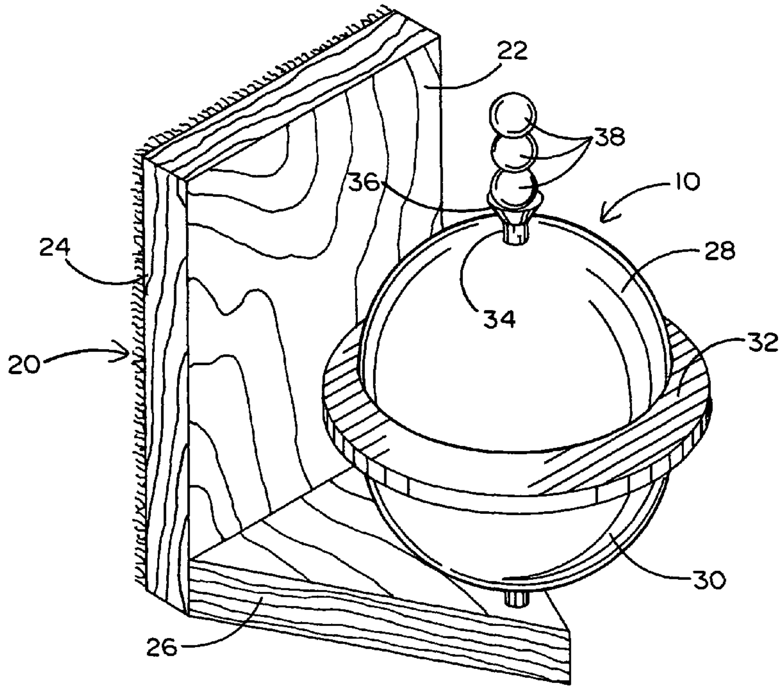
FIGS. 3-5 illustrate a preferred embodiment for a master acoustic resonator of the acoustic energy control system of this invention.
Figure 4:
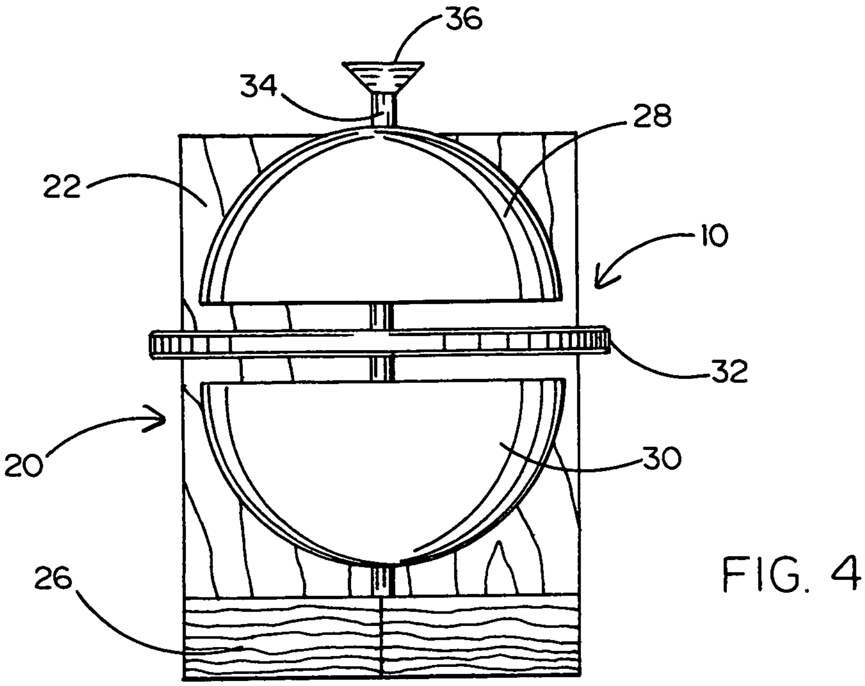
Figure 5:
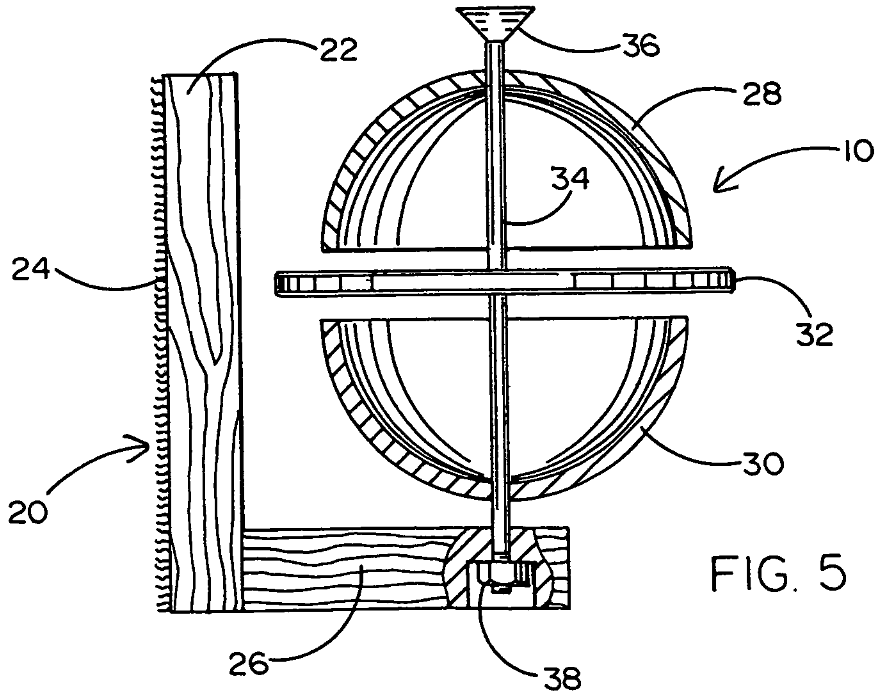

Details of the master acoustic resonator 10 to be attached to the front wall 5 of the room 1 are now disclosed while referring concurrently to FIGS. 3-5 of the drawings. The master acoustic resonator 10 is attached to the front wall by means of a generally L-shaped master acoustic resonator support 20. The resonator support 20 is preferably manufactured from a wood (e.g., maple) and includes a rectangular back 22 and a triangular stand 26. The particular wood from which the resonator support 20 is constructed is chosen to tune the master acoustic resonator 10 to any one of a broad range of frequencies at which the master acoustic resonator will vibrate. A piece of hook-and-loop fastener (i.e., Velcro) material 24 is attached to the back 22 of resonator support 20. A complementary piece of the hook-and-loop fastener material (not shown) is attached to the front wall (designated 5 in FIGS. 1 and 2) at the desired elevation of the master acoustic resonator 10. The fastener material 24 at the back 22 of the master acoustic resonator support 20 is moved into mating engagement with the fastener material at the front wall 5 of the room 1, whereby the support 20 will be detachably connected to the front wall. However, other fasteners (e.g., glue, epoxy, hooks, tacking material, etc.) can be used in place of the hook-and-loop fasteners. The stand 26 of the resonator support 20 is connected to the bottom of the back 22 so as to be aligned with and extend outwardly from the back 22 at a right angle. The stand 26 of resonator support 20 is ideally triangular in order that the sound wave dispersion pattern produced by the master acoustic resonator 10 can be controlled depending upon the angles of the stand 26.

The master acoustic resonator 10 includes a downwardly facing upper resonator bowl 28, an upwardly facing lower resonator bowl 30 located below the upper bowl 28, and a flat intermediate resonator disk or cylindrical plate 32 located therebetween and spaced from each of the upper and lower resonator bowls 28 and 30. Each of the oppositely-facing upper and lower resonator bowls 28 and 30 as well as the intermediate disk 32 of resonator 10 is ideally manufactured from steel, brass, iron or any other suitable metallic material. The particular metal from which the resonator bowls 28 and 30 and resonator plate 32 are manufactured is chosen to control the frequency at which the bowls and plate vibrate so that the resonator 10 can be tuned to the target harmonics. By way of a preferred embodiment, the diameter of each of the upper and lower resonator bowls 28 and 30 of the master acoustic resonator 10 is about 7.5 cm. The diameter of the intermediate disk resonator 32 is about 10.5 cm. The intermediate disk resonator 32 is separated from each of the upper and lower resonator bowls by about 1 cm.

The master acoustic resonator 10 is suspended above the stand 26 of the master acoustic resonator support 20 by means of a rod 34. The rod 34 which is manufactured from metal, plastic, or the like, runs axially and vertically through the upper and lower resonator bowls 28 and 30 and the intermediate resonator disk 32 therebetween. The bottom end of the rod 34 below the lower resonator bowl 30 is connected to the stand 26 of support 20. As shown in FIG. 5, the bottom end of rod 34 is threaded, and a correspondingly threaded nut 38 is mated to the threaded end so that the rod 34 projects upwardly from the stand 26. A cup-shaped cap 36 is located at the opposite top end of the rod 34 which projects above the upper resonator bowl 28. The end cap 36 of rod 34 is sized and shaped to receive one or more spherical magnets 38 that are stacked one above the other.

The master acoustic resonator 10 vibrates in response to the acoustic output from the audio speakers 3 of FIGS. 1 and 2 to excite the low frequency acoustic resonator 12 and the side and rear wall satellite resonators 14 and 16. That is to say, the upper and lower resonator bowls 28 and 30 and intermediate resonator disk 32 of resonator 10 create a broad sound wave dispersion pattern throughout the room 1 in which the speakers are located. The spherical magnets 38 (of FIG. 3) that are seated upon the end cap 36 of the rod 34 dampen the mechanical vibrations of the resonator bowls 28 and 30 and intermediate resonator disk 32.

Figure 6:
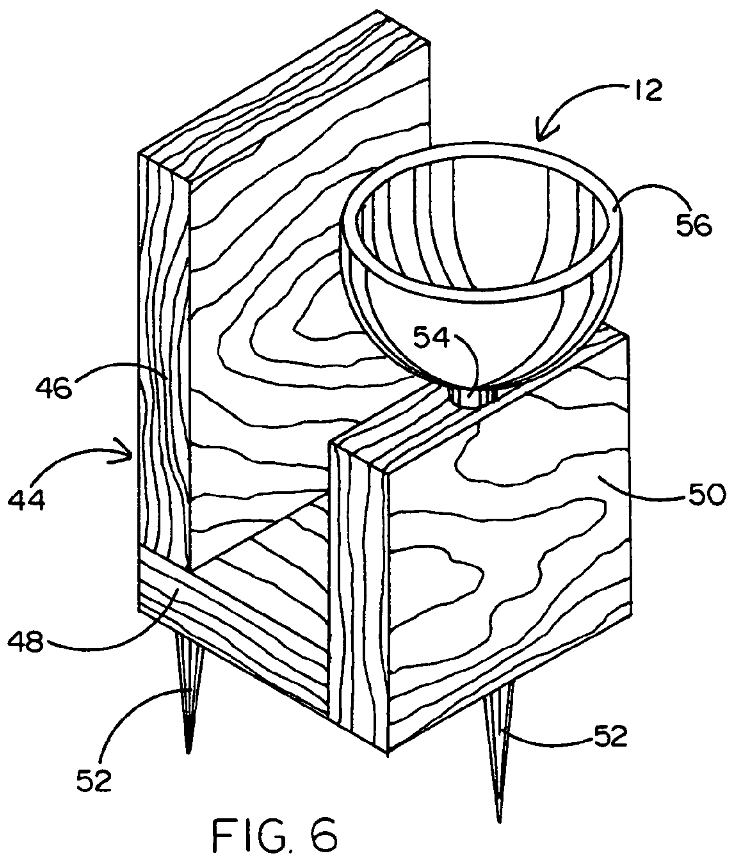
FIGS. 6 and 7 illustrate a preferred embodiment for a low frequency acoustic resonator of the acoustic energy control system of this invention.
Figure 7:
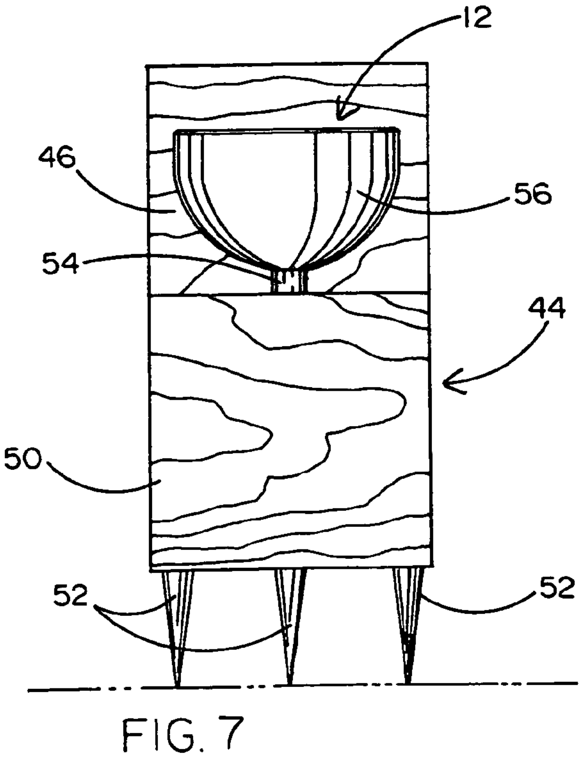

The details of the low frequency (i.e., bass) acoustic resonator 12 located below the master acoustic resonator 10 are disclosed while referring concurrently to FIGS. 6 and 7 of the drawings. The low frequency acoustic resonator 12 is held above the floor of the room 1 by means of a resonator support 44. The resonator support 44 includes a back 46, a base 48 and a stand 50. Like the master acoustic resonator support (designated 20 in FIGS. 3-5), the resonator support 44 of low frequency acoustic resonator 12 is preferably manufactured from a wood which is selected to enable the resonant frequency thereof be tuned. Each of the back 46, the bottom 48 and the stand 50 of the resonator support 44 has a rectangular configuration. The back 46 of support 44 is connected atop one end of the base 48, and the opposite end of the base 48 is connected to the bottom of the stand 50. The back and stand 46 and 50 of the support 44 extend in spaced parallel alignment from opposite ends of the base 48. A set of (e.g., stainless steel) spikes 52 projects downwardly from the base 48 of the resonator support 44. The spikes 52 terminate at sharp tips which rest upon the floor adjacent the front wall of the room 1 of FIGS. 1 and 2. A cylindrical (e.g., marine brass) seat 54 is connected to the top of the stand 50.

The low frequency acoustic resonator 12 includes an upturned resonator bowl 56 which is laid upon the seat 54 at the top of the stand 50 of the resonator support 44. Like the upper and lower resonator bowls 28 and 30 of the master acoustic resonator 10 of FIGS. 3-5, the resonator bowl 56 of the acoustic resonator 12 is preferably manufactured from steel, brass, iron or the like. The seat 54 acoustically couples the steel resonator bowl 56 to the wooden resonator support 44. Also like the upper and lower resonator bowls of the master acoustic resonator 10, the diameter of the upturned resonator bowl 56 of low frequency acoustic resonator 12 is preferably approximately about 7.5 cm.

The length of the spikes 52 at the bottom of the resonator support 44 adjusts the acoustic characteristics of the resonator bowl 56 depending upon the size of the room in which the low frequency acoustic resonator 12 is located. Therefore, it is preferable that the spikes 52 be removably connected to the base 48 of support 44 such as, for example, by means of screw fittings therebetween. In this manner, spikes of different size can be removably connected to support 44 when the resonator bowl 56 of the low frequency acoustic resonator 12 is moved from one room to a different room having a different size.

The back 46 of the resonator support 44 of the low frequency acoustic resonator 12 stands upwardly from the base 48 slightly above the resonator bowl 56. The back 46 functions as an audio dispersion baffle to block the transmission of sound waves produced by the resonator bowl 56 as it vibrates in response to sound waves in the bass range distributed thereto from the speakers 3 and the master acoustic resonator 10. In this regard, it is preferable that the resonator 12 be positioned such that the resonator bowl 56 faces the front wall of the room and the back 46 of the resonator support 44 faces the listener.

Details of the satellite acoustic resonators 14 to be held against the opposing side walls 7 and 8 of the room 1 of FIG. 1 and the identical satellite acoustic resonator 16 to be held against the rear wall 6 are disclosed while referring concurrently to FIGS. 8 and 9 of the drawings. Each of the satellite acoustic resonators 14 and 16 is held against a respective one of the rear or side walls 6, 7 and 8 by means of an identical satellite acoustic resonator support 60. Each satellite resonator support 60 includes a triangular body 62 that is preferably manufactured from wood so that the resonant frequency of the acoustic resonators 14 and 16 can be selectively adjusted. A piece of hook-and-loop (i.e., Velcro) fastener material 64 is attached to the back (i.e., the longest side) of the triangular support body 62. A complimentary piece of hook-and-loop fastener material (not shown) is attached to each of the rear wall 6 and the side walls 7 and 8 of the room 1 at the desired elevation of the satellite acoustic resonators 14 and 16 above the floor. The fastener material 64 of the resonator support body 62 is moved into detachable mating engagement with the fastener material at a respective one of the rear and side walls 6-8. However, other fasteners (e.g., glue, epoxy, hoods, tacking material, etc.) can be used in place of the hook-and-loop fasteners A cylindrical seat 66 is connected to the top of the body 62 of the satellite acoustic resonator support 60.

Like the master acoustic resonator 10 (of FIGS. 3-5) and the low frequency acoustic resonator 12 (of FIGS. 6 and 7), each of the satellite acoustic resonators 14 and 16 includes an upturned bowl 68 that is manufactured from steel, brass, iron or the like. Similarly, the diameter of each of the acoustic resonator bowls is preferably about 7.5 cm. The seat 66 upon which the steel resonator bowl 68 is laid acoustically couples the resonator bowl 68 to the wooden satellite acoustic resonator support 60. The resonator bowl 68 of each of the satellite acoustic resonators 14 and 16 is responsive to the sound waves emitted by the speakers 3 and reflected thereto by the master acoustic resonator 10 and the low frequency acoustic resonator 12.

In the case where the satellite acoustic resonator support 60 is to be attached to one of the side walls of a room, the seat 66 at the top of the support body 62 is manufactured from a magnetic material. The size of the magnetic seat 66 located between the steel resonator bowl 68 and the wooden resonator support 60 helps to control the resonant characteristics of resonator bowl 68 that is magnetically attracted thereto. In the case where the satellite acoustic resonator support 60 is to be attached to the rear wall of the room, the seat 66 at the top of support body 62 is manufactured from a non-magnetic material. Thus, the resonator bowl 68 rests upon the non-magnetic seat 66 under the influence of gravity. A magnetic seat 66 on which to lay the resonator bowl 68 dampens the high frequency excitation of the resonator bowl 68 more than a non-magnetic seat in response to the sound waves reflected thereto by the speakers 3 and the master acoustic resonator 10 located at the front of the room.

By virtue of the mechanical acoustic energy control system herein disclosed and the location of the space-efficient (relative to a conventional speaker), aesthetically-pleasing master acoustic resonator 10, low frequency acoustic resonator 12, and satellite acoustic resonators 14 and 16 located at the front, rear and side walls of the room 1 (of FIG. 1) in which a listener is seated, the acoustic energy output of by the audio speakers 3 is redirected and retransmitted by the resonators so that the listener will be surrounded with sound which provides a more realistic representation of the original sound than that commonly available in the average listening room at home or in less than an ideal theater, auditorium or music hall. In other words, sound will appear to the listener to originate from all directions, such that a richer, fuller and more natural audio effect is produced without requiring that additional speakers be purchased and interconnected with the speakers 3 at the front of the room 1. In particular, it has been found that the acoustic resonator bowls 28, 30, 56 and 68 will be excited and vibrate at a combined wide frequency range to control the dispersion pattern of the acoustic waves in the room. For large rooms, the size (i.e., diameter) of the acoustic resonator bowls can be increased for selectively adjusting the acoustics of the particular room and correspondingly controlling the acoustic energy distribution therewithin. In this same regard, additional satellite acoustic resonators 14 and 16 can be mounted on the side and rear walls of the room.

The invention claimed is:

1. An acoustic energy control system for use in a room to redistribute throughout the room acoustic energy produced by an acoustic energy source located in the room, said acoustic energy control system comprising:

a master acoustic resonator including a pair of resonator bowls and a master acoustic resonator support to which said pair of resonator bowls are attached so as to be held in spaced facing alignment with one another, said master acoustic resonator located in the room adjacent the acoustic energy source so that said pair of resonator bowls vibrate in response to the acoustic energy produced by the acoustic energy source and generate acoustic waves corresponding thereto; and at least one satellite acoustic resonator including a resonator bowl and a satellite acoustic resonator support to which said resonator bowl is coupled, said at least one satellite acoustic resonator located in the room with respect to said master acoustic resonator so that said satellite acoustic resonator bowl becomes excited by the acoustic energy produced by the acoustic energy source and by the acoustic waves produced by the pair of resonator bowls of said master acoustic resonator, whereby the resonator bowl of said satellite acoustic resonator vibrates to control the dispersion pattern of the acoustic waves within the room.

2. The acoustic energy control system recited in claim 1, wherein each of the pair of resonator bowls of said master acoustic resonator and the resonator bowl of said satellite acoustic resonator is manufactured from metal.

3. The acoustic energy control system recited in claim 1, wherein each of said master acoustic resonator support and said satellite acoustic resonator support is manufactured from wood.

4. The acoustic energy control system recited in claim 1, wherein said master acoustic resonator also includes an intermediate resonator disk located between said pair of spaced facing resonator bowls, said intermediate resonator disk vibrating with said pair of resonator bowls in response to the acoustic energy produced by the acoustic energy source.

5. The acoustic energy control system recited in claim 4, wherein each of said pair of resonator bowls and said intermediate resonator disk located therebetween is manufactured from metal.

6. The acoustic energy control system recited in claim 4, wherein said master acoustic resonator also includes a rod standing upwardly from said master acoustic resonator support and extending axially through each of said pair of resonator bowls and said intermediate resonator disk for holding said pair of resonator bowls in said spaced-facing alignment with one another with said intermediate resonator disk located therebetween, and at least one magnet coupled to said upstanding rod.

7. The acoustic energy control system recited in claim 6, wherein said master acoustic resonator support includes a back and a base projecting outwardly from said back, said rod connected to and standing upwardly from the base of said support.

8. The acoustic energy control system recited in claim 7, further comprising a fastener located on the back of said master acoustic resonator support, said fastener adapted to be connected to a wall of the room in which said master acoustic resonator is located, such that said master acoustic resonator is held above the floor of the room.

9. The acoustic energy control system recited in claim 1, wherein the satellite acoustic resonator support of said at least one satellite acoustic resonator includes a body having a top and a back and a seat connected to said top, the resonator bowl of said satellite acoustic resonator positioned upon said seat.

10. The acoustic energy control system recited in claim 9, wherein the seat connected to the top of the body of said satellite acoustic resonator support is manufactured from a magnetic material.

11. The acoustic energy control system recited in claim 9, further comprising a fastener attached to the back of the body of said satellite acoustic resonator support, said fastener adapted to be connected to a wall of the room in which said at least one satellite acoustic resonator is located, such that said satellite acoustic resonator is held above the floor of the room.

12. The acoustic energy control system recited in claim 1, wherein the room in which said system is used has a front wall, a rear wall, and a pair of opposing side walls, said system comprising a plurality of satellite acoustic resonators, each of which including a resonator bowl and a satellite acoustic resonator support to which said resonator bowl is coupled, said system further comprising a plurality of fasteners attached to respective ones of the satellite acoustic resonator supports, said plurality of fasteners adapted to be connected to respective ones of the rear and side walls of the room when said master acoustic resonator is located at the front wall of the room, such that said plurality of satellite acoustic resonators are held above the floor of the room.

13. The acoustic energy control system recited in claim 1, further comprising a low frequency acoustic resonator including a resonator bowl and a resonator bowl support to which said resonator bowl is coupled, said low frequency resonator located in the room so that the resonator bowl of said low frequency acoustic resonator vibrates in response to low frequency acoustic waves produced by said acoustic energy source and by said master acoustic resonator in order to distribute said low frequency acoustic waves within the room.

14. The acoustic energy control system recited in claim 13, wherein the resonator bowl of said low frequency acoustic resonator is manufactured from metal.

15. The acoustic energy control system recited in claim 13, wherein the resonator bowl support of said low frequency acoustic resonator is manufactured from wood.

16. The acoustic energy control system recited in claim 13, wherein the resonator bowl support of said low frequency acoustic resonator includes a back, a stand located opposite said back, and a base extending between said back and said stand, the resonator bowl of said low frequency acoustic resonator being coupled to said resonator bowl support at the stand thereof.

17. The acoustic energy control system recited in claim 16, further comprising a metallic seat connected to the stand of said resonator bowl support, the resonator bowl of said low frequency acoustic resonator positioned upon said seat.

18. The acoustic energy control system recited in claim 16, wherein each of the back and the stand extend above the base of said resonator bowl support, said back extending higher than said stand and above the resonator bowl of said low frequency acoustic resonator.

19. The acoustic energy control system recited in claim 16, wherein said resonator bowl support has a plurality of metal spikes connected to and extending from the base thereof, whereby said low frequency acoustic resonator stands on the floor of the room.

20. An acoustic energy control system for use in a room to redistribute throughout the room acoustic energy produced by an acoustic energy source located in the room, the room having a front wall, a rear wall and a pair of opposing side walls, and said acoustic energy control system comprising:

a master acoustic resonator including at least one resonator bowl and a master acoustic resonator support to which said at least one resonator bowl is coupled, said master acoustic resonator located at the front wall of the room adjacent the acoustic energy source so that said master acoustic resonator bowl vibrates in response to the acoustic energy produced by the acoustic energy source and generates acoustic waves corresponding thereto;

a plurality of satellite acoustic resonators each of which including a resonator bowl and a satellite acoustic resonator support to which said resonator bowl is coupled, said plurality of satellite acoustic resonators located in the room with respect to said master acoustic resonator so that the satellite acoustic resonator bowls thereof become excited by the acoustic energy produced by the acoustic energy source and by the acoustic waves produced by the resonator bowl of said master acoustic resonator, whereby the resonator bowls of said plurality of satellite acoustic resonators vibrate to control the dispersion pattern of the acoustic waves within the room; and a plurality of fasteners attached to respective ones of the satellite acoustic resonator supports of said plurality of satellite acoustic resonators, said plurality of fasteners adapted to be connected to respective ones of the rear and side walls of the room, such that said plurality of satellite acoustic resonators are held above the floor of the room.

21. An acoustic energy control system for use in a room to redistribute throughout the room acoustic energy produced by an acoustic energy source located in the room, said acoustic energy control system comprising:

a master acoustic resonator including a pair of resonator bowls and a master acoustic resonator support to which said pair of resonator bowls are attached so as to be held in spaced facing alignment with one another, said master acoustic resonator located in the room adjacent the acoustic energy source so that said pair of resonator bowls vibrate in response to the acoustic energy produced by the acoustic energy source and generate acoustic waves corresponding thereto;

an intermediate resonator disk located between said pair of spaced facing resonator bowls to vibrate with said pair of resonator bowls in response to the acoustic energy produced by the acoustic energy source;

at least one satellite acoustic resonator including a resonator bowl and a satellite acoustic resonator support to which said resonator bowl is coupled, said at least one satellite acoustic resonator located in the room with respect to said master acoustic resonator so that said satellite acoustic resonator bowl becomes excited by the acoustic energy produced by the acoustic energy source and by the acoustic waves produced by the pair of resonator bowls of said master acoustic resonator, whereby the resonator bowl of said satellite acoustic resonator vibrates to control the dispersion pattern of the acoustic waves within the room;

a rod standing upwardly from said master acoustic resonator support and extending axially through each of said pair of resonator bowls and said intermediate resonator disk for holding said pair of resonator bowls in said spaced facing alignment with one another with said intermediate resonator disk located therebetween; and at least one magnet coupled to said upstanding rod.

* * * * *